United States Patent [19]
Anami

[11] Patent Number: 4,768,166
[45] Date of Patent: Aug. 30, 1988

[54] SEMICONDUCTOR STATIC MEMORY DEVICE WITH CELL GROUNDING MEANS FOR REDUCED POWER CONSUMPTION

[75] Inventor: Kenji Anami, Hyogo, Japan

[73] Assignee: Mitsubishi Denki Kabushiki Kaisha, Tokyo, Japan

[21] Appl. No.: 97,330

[22] Filed: Sep. 10, 1987

Related U.S. Application Data

[63] Continuation of Ser. No. 728,539, Apr. 29, 1985, abandoned.

[30] Foreign Application Priority Data

Apr. 28, 1984 [JP] Japan .................. 59-86876

[51] Int. Cl.[4] .................. G11C 7/00; G11C 8/00
[52] U.S. Cl. .................. 365/154; 365/227; 365/230
[58] Field of Search .................. 365/154, 182, 189, 190, 365/226, 227, 229, 230; 307/296 R; 323/313, 314

[56] References Cited

U.S. PATENT DOCUMENTS

| | | | |
|---|---|---|---|
| 4,120,047 | 10/1978 | Varadi | 365/190 |
| 4,409,679 | 10/1983 | Kurafuji et al. | 365/190 |
| 4,455,628 | 6/1984 | Ozak et al. | 307/296 R |
| 4,542,486 | 9/1985 | Anami et al. | 365/230 |

FOREIGN PATENT DOCUMENTS 0090290 5/1984 Japan .................. 365/227

Primary Examiner—Stuart N. Hecker
Assistant Examiner—Glenn A. Gossage
Attorney, Agent, or Firm—Sughrue, Mion, Zinn, Macpeak & Seas

[57] ABSTRACT

A semiconductor static memory device in which the power consumption is minimized. The memory cells are grouped in column blocks and rows. A NAND gate is provided for each such group, with the output of the NAND gate being coupled to the ground terminals of the cells in its group. The input terminals of the NAND gates receive respective row and column block selection signals. A potential generator is provided in each cell for boosting the potential of the ground terminal of the cell above the potential of the word line, less a threshold voltage of one of the access transistors of the cell, when the corresponding block is not selected. The NAND gates set the potential of the ground terminal at ground voltage when both the column block and word line signals applied thereto are in the high state.

1 Claim, 3 Drawing Sheets

SEMICONDUCTOR STATIC MEMORY DEVICE WITH CELL GROUNDING MEANS FOR REDUCED POWER CONSUMPTION

This is a continuation of application Ser. No. 728,539 filed Apr. 29, 1985 now abandoned.

BACKGROUND OF THE INVENTION

The present invention relates to a semiconductor static memory device and, particularly, to an improvement of such semiconductor static memory device, whereby the power consumption of the device is minimized.

FIG. 1 shows a memory unit of a typical conventional semiconductor static memory device in which reference numerals 1, 2, 3, and 8a and 8b depict a memory cell, a word line, bit lines, and bit line loads, respectively. The memory cell 1 is composed of inverter transistors 4a and 4b, access transistors 5a and 5b, load resistors 6a and 6b, and memory nodes 7a and 7b. A plurality of such memory units are connected to the word line 2, and a plurality of the word lines 2 are arranged in parallel so that memory units arranged in the same vertical position constitute a column, thereby forming a matrix of the memory units. A row decoder is connected to each word line and a column decoder is provided for each column so that a particular memory unit can be accessed by activating the corresponding row decoder and column decoder.

In such a static memory device, information is stored at the memory nodes 7a and 7b. Assuming that the memory nodes 7a and 7b store an H (high-level information bit) and an L (low-level information bit), respectively, a current (referred to as a "column current") flows from a power source $V_{cc}$ through the bit line load 8b, the access transistor 5b, and the inverter transistor 4b of the memory cell 1 to a ground point when the memory cell 1 is selected by setting the word line 2 to the H level. However, a problem arises in such a static RAM in that the column current flows into all memory cells connected to a word line 2 activated by a row decoder. The column current flowing into memory cells in columns other than that selected by a column decoder results in a waste of power.

In order to reduce such ineffective column currents, as proposed in Japanese Kokai Publication No. 55-122290, of which one of the applicants is the present inventor, each word line can be divided into a pair of word line segments and a row decoder associated with the word line arranged between the word line segments. In this case, only one of the word line segments is activated at any one time, thereby reducing in half the column current.

In order to further reduce the ineffective column current, it has proposed, as disclosed in Japanese KoKai Publication No. 58-211393, whose equivalent is U.S. Pat. No. 4,542,486, of which one of the applicants is the present inventor, to divide each word line into a number of word line segments so that each segment belongs to a block of columns and to activate one of the word line segments by using a row selection line and a column block selection signal. The latter proposal is very effective and has been put to actual practice in a 64K static RAM. (See *ISSCC Digest of Technical Papers*, pp. 58, 59 (February 1983)). However, this system requires the addition of row selection lines parallel to the word lines, causing the structure of each memory cell to be complicated.

As another approach of reducing the column current, Japanese Kokai Publication No. 56-143587, whose equivalent is U.S. Pat. No. 4,409,679, proposes to increase the potential of ground terminals of memory cells in columns not selected. However, this approach is unsuccessful in completely eliminating unwanted column currents, and, since each ground line is commonly used by all of the memory cells in a column, the associated parasitic capacitance, which is a load on the ground line, is large, resulting in a large current required to charge and discharge it.

*ISSCC Digest of Technical Papers*, pp. 258, 259 (February 1982), and *ISSCC Digest of Technical Papers*, pp. 260, 261 (February 1982) disclose a method of driving a bit line load with a pulse to cut out the column current. This method is effective in reducing the steady-state component of the column current, but is ineffective in eliminating the transient component thereof.

SUMMARY OF THE INVENTION

It is a primary object of the present invention to eliminate the disadvantages inherent to the above-mentioned prior art approaches.

Another object of the invention is to provide a semiconductor static memory device having a very low power consumption.

The above objects are achieved according to the present invention by increasing the potential of the ground terminals of memory cells in nonselected columns or nonselected rows and setting the voltage level of the word lines below the potential of the ground terminals of the nonselected cells plus a threshold voltage of an access transistor. With this arrangement steady-state and transient current components are prevented from flowing into the access transistor.

DESCRIPTION OF THE PREFERRED EMBODIMENTS

Figure 2:
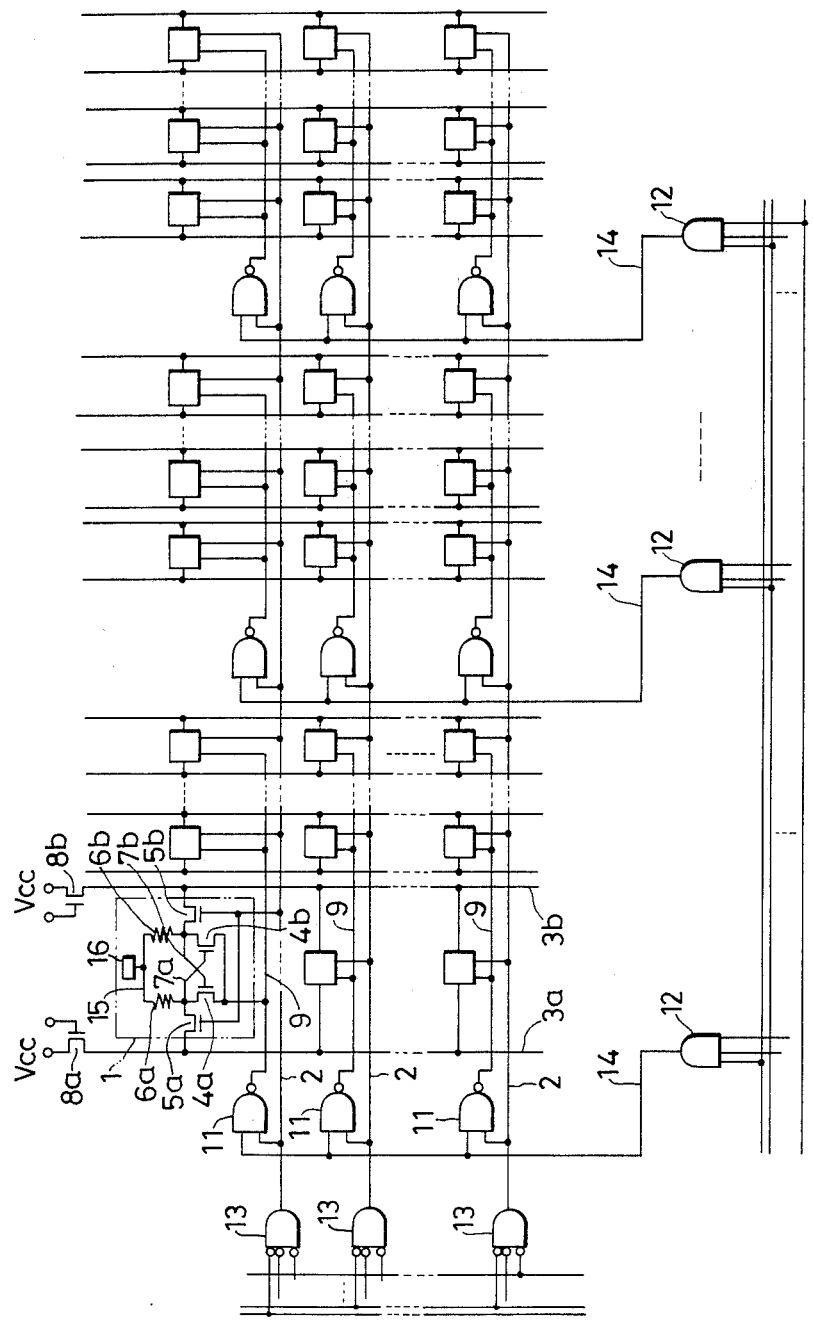
FIG. 2 shows an embodiment of a semiconductor static memory device according to the present invention.

In FIG. 2, a static memory device according to an embodiment of the present invention includes memory cells 1 arranged in rows and columns, word lines 2 for respective memory cell rows, a pair of bit lines 3a and 3b for each column, bit line loads 8a and 8b for respective bit lines in each column, and ground lines 9 at a variable potential $V_{ss}$ connected to the memory cells in corresponding rows. The columns are grouped to form a plurality of column blocks. The memory device further includes NAND gates 11, each having inputs connected to a respective word line 2 and a respective column block selecting line 14, column (Y) block selectors 12 each composed of an AND gate having inputs supplied with column (Y) address signals, and row (X) decoders 13 each having inputs supplied with row (X) address signals. The memory cell 1 includes inverter transistors 4a and 4b, load resistors 6a and 6b, memory nodes 7a and 7b, access transistors 5a and 5b, and a potential generator 16 connected through a potential point 15 to the load resistors 6a and 6b.

The NAND gate 11 functions to: (1) for selected cells, set the potential $V_{ss}$ of the ground line of the associated block to actual ground potential (0 volts) only when both a column block selecting signal and a row selection signal supplied from the respective column block selector 12 and row selector 13 are in the H state; and, (2) for nonselected cells, in cooperation with the potential generator 16, set the potential $V_{ss}$ to an intermediate potential higher than ground potential and, at the same time, set the potential level of the word line 2 to a value lower than the then-present potential $V_{ss}$ plus the threshold voltage $V_{th}$ of one of the access transistors 5a and 5b when either of the column block or the row selecting signal supplied to the inputs thereof is in the L (low) state.

Figure 1:
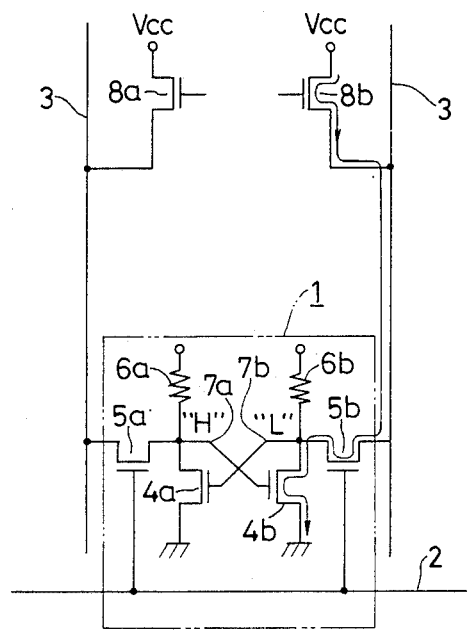
FIG. 1 is a circuit diagram showing a memory cell unit of a conventional semiconductor static memory device.
Figure 3:
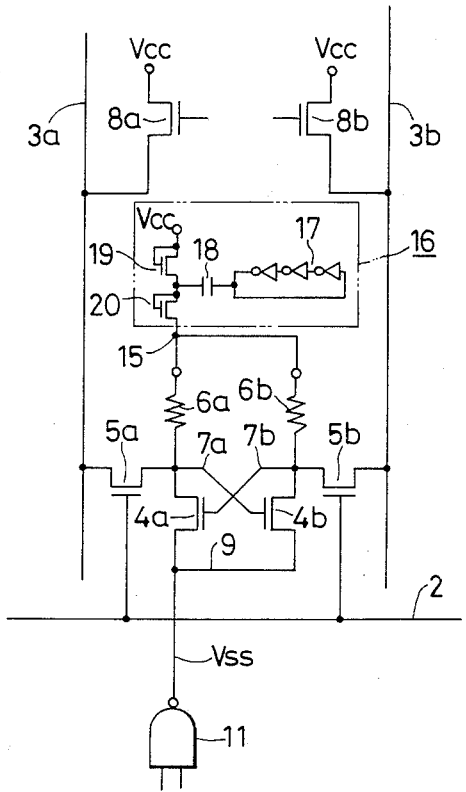
FIG. 3 is a circuit diagram of a memory cell portion of the semiconductor static memory device of FIG. 2.

FIG. 3 shows a detailed circuit diagram of the memory cell 1. In FIG. 3, the potential generator 16 includes a ring oscillator 17 composed of an odd number of series-connected identical inverters with a feedback connection, a transistor 19 having a source connected through a capacitor 18 to the ring oscillator 17 and a drain and a gate commonly connected to a voltage source $V_{cc}$, and a transistor 20 having a drain and a gate connected commonly through the capacitor 18 to the ring oscillator 17. With this construction, the H-state potential of the memory node 7 will be higher than the source voltage $V_{cc}$. For example, assuming that the source voltage $V_{cc}$ is 5 volts and the output amplitude of the ring oscillator 17 is 5 volts, the H-state potential will be about 8 volts. Therefore, the charge stored at the memory node 7 is maintained even if the potential on the line 9 is on the order of 5 volts.

Figure 4:
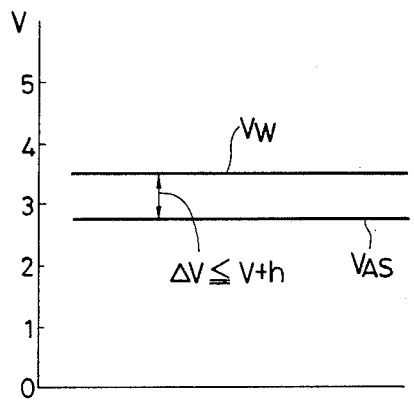
FIG. 4 is a graph showing a voltage level of a nonselected column block of a semiconductor static memory device of the invention.
Figure 5:
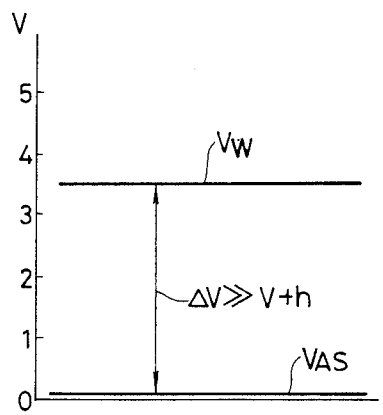
FIG. 5 is a graph showing a voltage level of a selected column block of a semiconductor static memory device of the invention.

The operation of the circuit of FIG. 3 will be described with reference to FIGS. 4 and 5.

Since, in a nonselected memory cell, the source voltage $V_{as}$ of the access transistor is increased to a potential which is equal to the sum of the potential $V_{ss}$ of the line 9 and a voltage drop of the inverter transistor, there is no case where the potential difference between the potential $V_w$ of the word line and the source potential $V_{as}$ of the access transistor reaches or exceeds the threshold voltage of the latter transistor and, therefore, the access transistor is completely turned off to completely block the column current flowing therethrough.

On the other hand, since, in a selected memory cell, a voltage which is substantially higher than the threshold voltage of the access transistor is applied between the gate and the source thereof as in the conventional circuit, normal read and write operations can be performed.

Further, when the selected memory cell is shifted from one in one row in one column block to another in another row in another column block, the only current flow required is that sufficient to charge a small capacitor of a formerly selected block to $V_{ss}$ and discharge a small capacitor of the newly selected block. Thus, the power consumption required for cell selection is minimized.

In accordance with the present invention, although a reduction of current consumption is realized by seg-mentation of the block in a fashion similar to that disclosed in Japanese Kokai Publication No. 58-211393, whose equivalent is U.S. Pat. No. 4,542,486, a single word line can be used for each row, resulting in a simplified construction of the memory cell.

In the above-described embodiment, the memory cell is of the high resistive load type. However, the present invention is applicable to other types of memory cells such as the ED- (enhancement depletion) type memory cell using depletion-type MOS transistors, or a CMOS-type memory cell using P-MOS transistors.

Although the potential generator 16 is connected to the potential point 15 in this embodiment, it is possible to connect it directly to the power source to set the point 15 to the source voltage.

As mentioned hereinbefore, according to the present invention, the columns are grouped into blocks. The ground potential of memory cells in nonselected column blocks or nonselected rows is increased, and the ground potential of the memory cell in the selected word line is set to a value which is equal to the sum of the ground potential of the memory cell in the nonselected column block or nonselected row and the threshold voltage of an access transistor. Therefore, there is no steady-state or transient current flowing into the memory cell in the nonselected column block and, due to the grouped columns, the electrostatic capacitance of the ground line of the memory cell is small. Consequently, the charging and discharging current required during switching between memory cells is small, resulting in a semiconductor static memory device having a low power consumption.

I claim:
1. A semiconductor memory device comprising:
   a two-dimensional memory cell array comprising a plurality of word lines and a plurality of memory cells arranged in rows and columns, each of said memory cells comprising:
      cross-coupled MOS transistor inverter means;
      access transistor means having gate terminals coupled to a corresponding one of said word lines;
      a first terminal for receiving a first potential;
      a ground terminal for receiving a second potential; and
      load means,
   said memory cells being grouped in columns to form a plurality of column blocks,
   said device further comprising:
   means for setting a potential of each said respective ground terminal of each memory cell to at least a potential of the corresponding word line reduced by a threshold voltage of said access transistor means when the corresponding block is not selected, said means for setting said potential including a plurality of switching means each provided for a row of said memory cells arranged in a corresponding column block, an output of each of said switching means being coupled to the memory cells in the respective row and column block and having its output enabled when one of said column blocks is activated within a particular row, said switching means each having a first input terminal connected to a respective one of said word lines and a second input terminal receiving a respective column block selection signal for setting a potential of the respective ground terminal at a ground voltage when both of said respective one of said word lines and said column block selection signal are in a high state, said means for setting a potential further comprising first means, disposed within each of said memory cells, said each of said memory cells storing information at a memory node as a first, high-state potential and a second, low-state potential, for setting said high-state potential to be higher than said first potential, said first means comprising a ring oscillator, a capacitor, a first transistor having a source connected through said capacitor to said ring oscillator, a drain connected to a voltage source, and a gate connected to said voltage source, and a second transistor having a source connected to said load means, a drain connected through said capacitor to said ring oscillator, and a gate connected to said drain of said second transistor.

* * * * *